(12) United States Patent
Chang et al.

(10) Patent No.: US 7,033,886 B2
(45) Date of Patent: Apr. 25, 2006

(54) PARTIAL VERTICAL MEMORY CELL AND METHOD OF FABRICATING THE SAME

(75) Inventors: Ming-Cheng Chang, Taoyuan Hsien (TW); Yi-Chen Chen, Taoyuan (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/998,219

(22) Filed: Nov. 26, 2004

(65) Prior Publication Data
US 2005/0090064 A1 Apr. 28, 2005

Related U.S. Application Data

(62) Division of application No. 10/640,100, filed on Aug. 13, 2003, now Pat. No. 6,969,881.

(30) Foreign Application Priority Data
May 30, 2003 (TW) ................................ 92114698 A

(51) Int. Cl.
*H01L 21/8242* (2006.01)

(52) U.S. Cl. ....................................... 438/243; 438/386
(58) Field of Classification Search ................ 438/238, 438/239, 242, 243, 248, 249, 386
See application file for complete search history.

(56) References Cited

U.S. PATENT DOCUMENTS 6,514,816 B1 * 2/2003 Lee ............................. 438/243

* cited by examiner

*Primary Examiner*—David Vu
(74) *Attorney, Agent, or Firm*—Quintero Law Office

(57) ABSTRACT

A partial vertical memory cell and fabrication method thereof. A semiconductor substrate is provided, in which two deep trenches having deep trench capacitors respectively are formed, and the deep trench capacitors are lower than a top surface of the semiconductor substrate. A portion of the semiconductor outside the deep trenches is removed to form a pillar between. The pillar is ion implanted to form an ion-doped area in the pillar corner acting as a S/D area. A gate dielectric layer and a conducting layer are conformally formed on the pillar sequentially. An isolation is formed in the semiconductor substrate beside the conducting layer. The conducting layer is defined to form a first gate and a second gate.

25 Claims, 13 Drawing Sheets

PARTIAL VERTICAL MEMORY CELL AND METHOD OF FABRICATING THE SAME

This application is a divisional of U.S. application Ser. No. 10/640,100, filed Aug. 13, 2003 now U.S. Pat. No. 6,969,881.

BACKGROUND OF THE INVENTION

1. Field of the Invention

The invention relates to a memory cell, and more particularly to a partial vertical memory cell of a DRAM and a method of fabricating the same.

2. Description of the Related Art

There is much interest in reducing the size of individual semiconductor devices to increase their density on an integrated circuit (IC) chip. This reduces size and power consumption of the chip, and allows faster operation. In order to achieve a memory cell of minimum size, the gate length in a conventional transistor must be reduced to decrease the lateral dimension of the memory cell. However, the shorter gate length results in higher leakage current that cannot be tolerated, and the voltage on the bit line must therefore also be scaled down. This reduces the charges stored on a storage capacitor, thus requiring a larger capacitance to ensure that stored charges are detected accurately.

FIGS. 1a to 1e are cross-sections of the conventional method of forming a horizontal memory cell.

In FIG. 1a, a silicon substrate 101 is provided. A gate dielectric layer 102, such as gate oxide layer, a conducting layer 103, such as doped poly layer or doped epi-silicon layer, and a patterned mask layer 104, such as nitride layer or photoresist layer, are sequentially formed on the silicon substrate 101.

In FIG. 1b, the conducting layer 103 and gate dielectric layer 102 are anisotropically etched using the patterned mask layer 104 to form a conducting layer 103a acting as a gate and a gate dielectric layer 102a.

In FIG. 1c, a liner layer 105, such as oxide layer, and an insulating layer 106, such as nitride layer, are conformally formed on the silicon substrate 101, the conducting layer 103a, and the exposed gate dielectric layer 102a.

In FIG. 1d, the liner layer 105 and the insulating layer 106 are anisotropically etched to form a spacer 106a and a liner layer 105a.

In FIG. 1e, the silicon substrate 101 is doped to form a Source/Drain (S/D) region beside the conducting layer 103a. A silicide layer 107 is formed on the conducting layer 103a and the S/D respectively.

As the gate size of the MOSFET decreases, a drive current and effect of the gate are difficult to keep high at a low operating voltage.

SUMMARY OF THE INVENTION

The present invention is directed to partial vertical memory cell and a method for forming the same.

Accordingly, the present invention provides a method for forming a partial vertical memory cell. A semiconductor substrate having two deep trenches with capacitors is provided, and the capacitors are lower than a top surface of the semiconductor substrate. A portion of the semiconductor substrate outside the deep trenches is removed to form a pillared active area between the deep trenches. The active area is ion implanted to form an ion-doped area in a corner of the active area acting as an S/D. A gate dielectric layer and a conducting layer are conformally formed on the active area. An isolation is formed beside the conducting layer. The conducting layer is defined to form a first gate and a second gate.

Accordingly, the present invention also provides another method for forming a partial vertical memory cell. A semiconductor substrate having two deep trenches with capacitors formed therein is provided, and the capacitors are lower than a top surface of the semiconductor substrate. An isolating layer is formed on each capacitor. Each deep trench is filled with a mask layer. A first patterned mask layer is formed on the semiconductor substrate between the deep trenches, and the first patterned mask layer partially covers the mask layer. The semiconductor substrate is etched using the first patterned mask layer and the mask layers as etching masks to further below its surface than the isolating layer, thereby forming a pillared active area between the deep trenches. The first patterned mask layer and the mask layers are removed. The active area beside the insulating layer is ion implanted to form an ion-doped area acting as a S/D. A gate dielectric layer and a conducting layer are conformally formed on the semiconductor substrate. A second patterned mask layer corresponding to the active area and the portion of the mask layers is formed to cover the conducting layer. The conducting layer is etched using the second patterned mask layer as an etching mask so that the conducting layer covering the active area remains. The second patterned mask layer is removed. A dielectric layer is formed on the semiconductor substrate to isolate the active area, and a height of the dielectric layer is equal to the conducting layer. A third patterned mask layer, having an opening partially exposing the conducting layer, is formed on the conducting layer and the dielectric. The conducting layer is etched using the third patterned mask layer as an etching mask until the gate dielectric layer is exposed to form a trench, and the conducting layer is insulated by the trench to form a first gate and a second gate.

Accordingly, the present invention also provides another method for forming a partial vertical memory cell. A semiconductor substrate having two deep trenches with capacitors is provided, the capacitors are lower than a top surface of the semiconductor substrate, and a collar insulating layer is formed on a top sidewall of each deep trench. An isolating layer is formed on each deep trench capacitor. Each deep trench is filled with a mask layer. A first patterned mask layer is formed on the semiconductor substrate between the deep trenches, and the first patterned mask layer partially covers the mask layer. The semiconductor substrate is etched using the first patterned mask layer and the mask layers as etching masks to further below its surface than the isolating layer, thereby forming a pillared active area between the deep trenches. The first patterned mask layer and the mask layers are removed. A sacrificial layer is conformally formed on the semiconductor substrate outside the active area. A first dielectric layer is formed on the sacrificial layer. The first dielectric layer and the sacrificial layer are planarized until the active area is exposed to further below their surfaces than the active area by a predetermined depth. The active area is etched using the first dielectric layer and the sacrificial layer as etching masks to round corners of the active area. The first dielectric layer is removed. The active area beside the insulating layer is ion implanted to form an ion-doped area acting as an S/D. The sacrificial layer is removed. The semiconductor substrate is oxidized to form a gate dielectric layer. A conducting layer is conformally formed on the gate dielectric layer. A second patterned mask layer corresponding to the active area and the portion of the mask layers is formed to cover the conducting layer. The conducting layer is etched using the second patterned mask layer as an etching mask to form a gate. The second patterned mask layer is removed. A second dielectric layer is formed on the semiconductor substrate. The second dielectric layer is planarized until the gate is exposed to form an isolation for isolating the active area. A third patterned mask layer, having an opening partially exposing the conducting layer, is formed on the conducting layer and the dielectric. The conducting layer is etched using the third patterned mask layer as an etching mask until the gate dielectric layer is exposed to form a trench, and the gate is insulated by the trench to form a first gate and a second gate. The third patterned mask layer is removed. A spacer is formed on a sidewall of the trench to avoid electrical connection of the first gate and the second gate.

Accordingly, the present invention also provides a partial vertical memory cell comprising a semiconductor substrate with a pillared active area, two deep trench capacitors formed in the semiconductor substrate beside the active area, two S/D regions formed in the active area beside the deep trench capacitors, a gate dielectric layer formed on a surface of the active area, and two gates conformally formed on the gate dielectric layer around two top corners of the active area. The two gates are independent from one another.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1A:
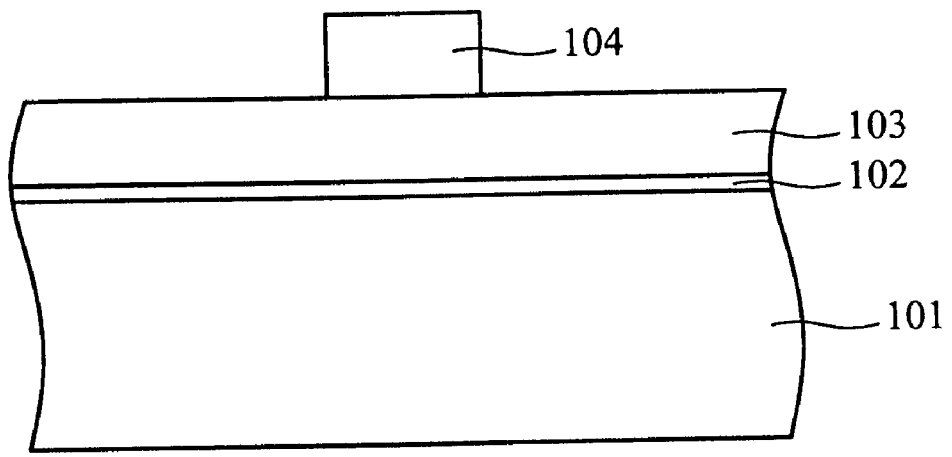
FIGS. 1a to 1e are cross-sections of the conventional method for forming a horizontal memory cell.
Figure 1B:
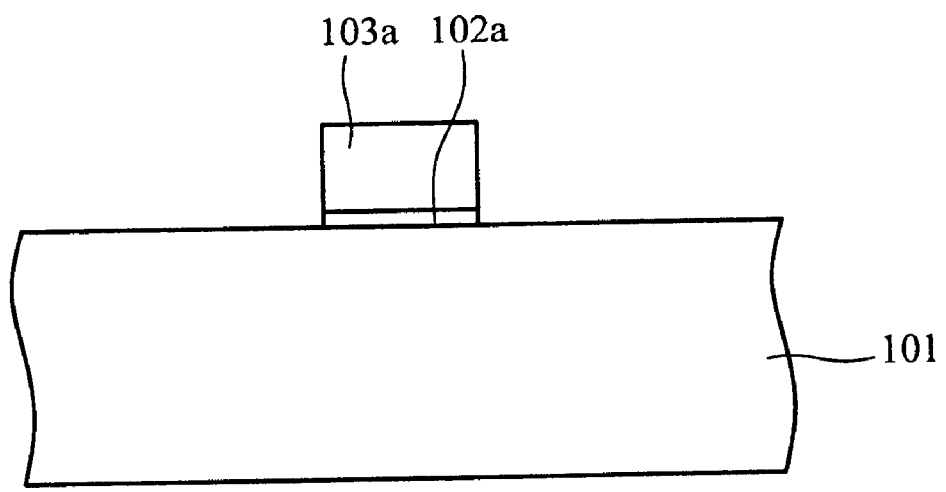
Figure 1C:
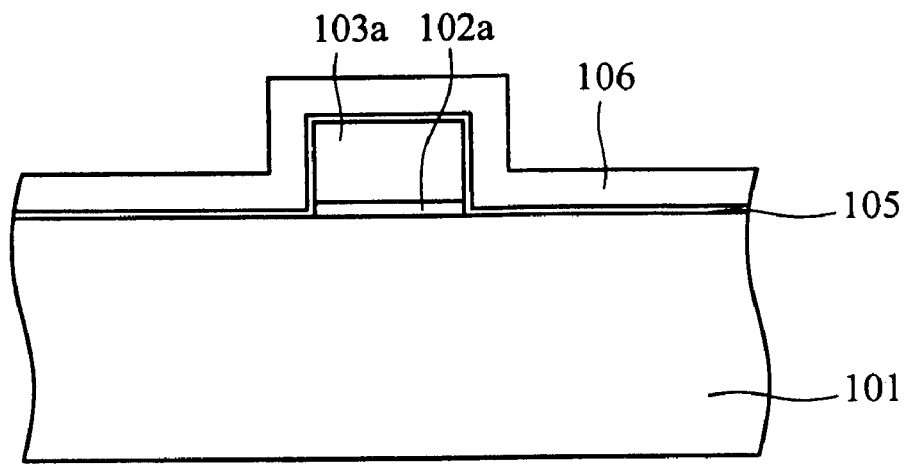
Figure 1D:
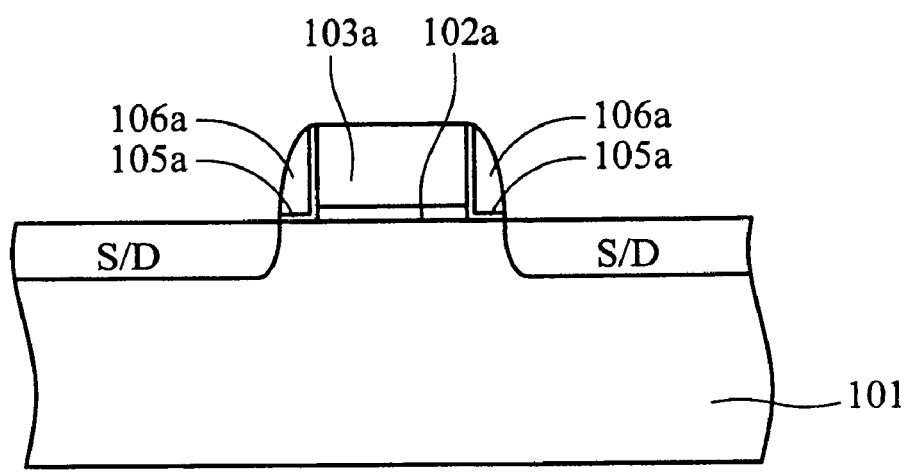
Figure 1E:
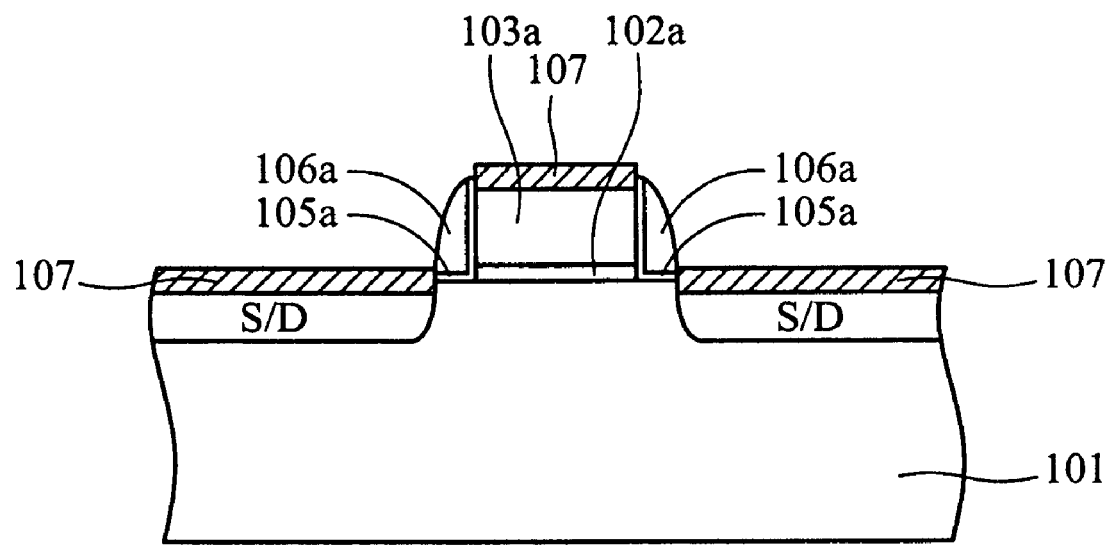
Figure 2A:
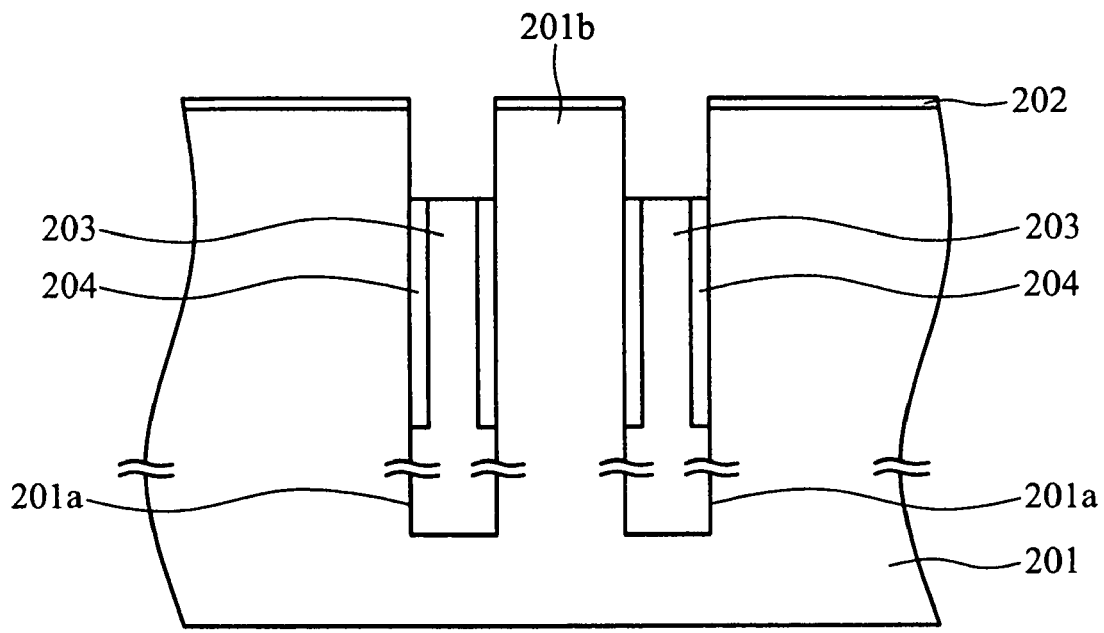
FIGS. 2a to 2t are cross-sections of the method for forming a partial vertical memory cell of the present invention.
Figure 2B:
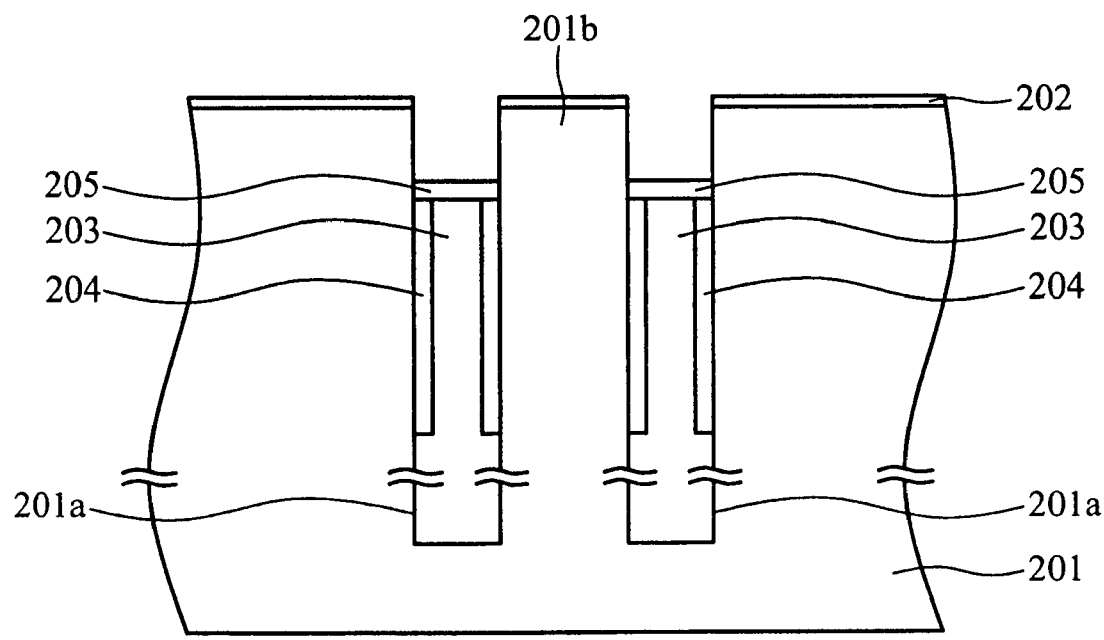
Figure 2C:
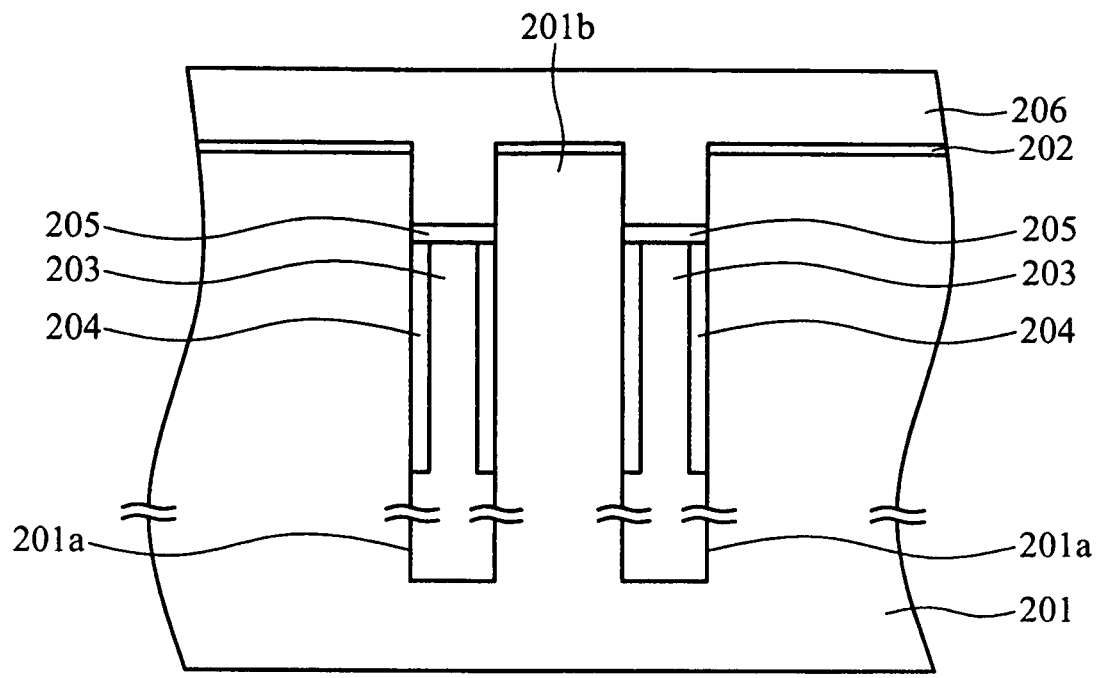
Figure 2D:
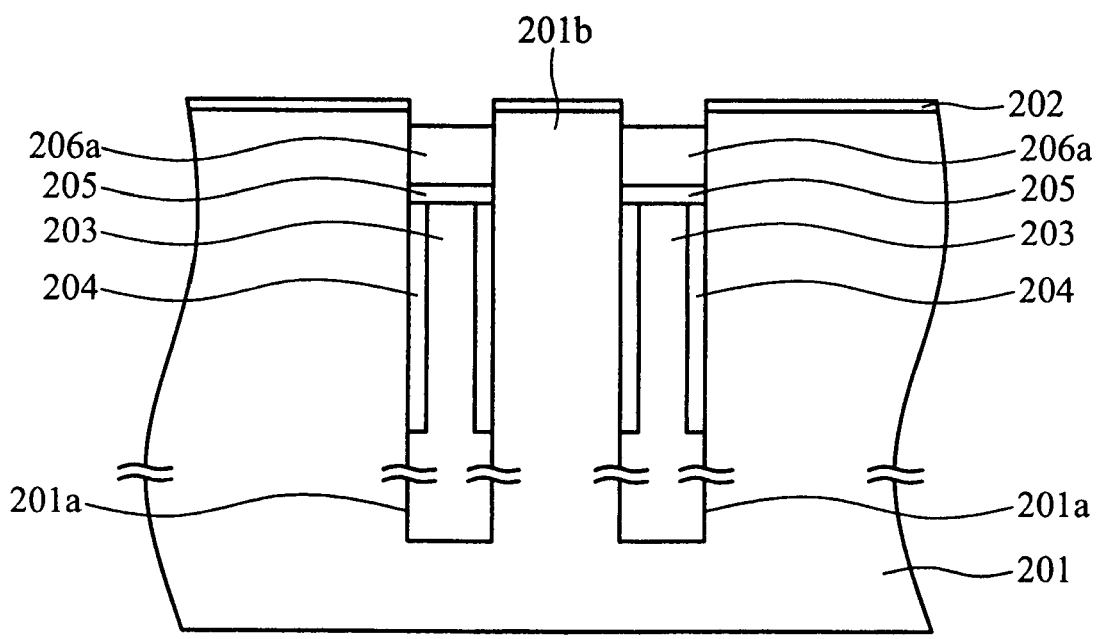
Figure 2E:
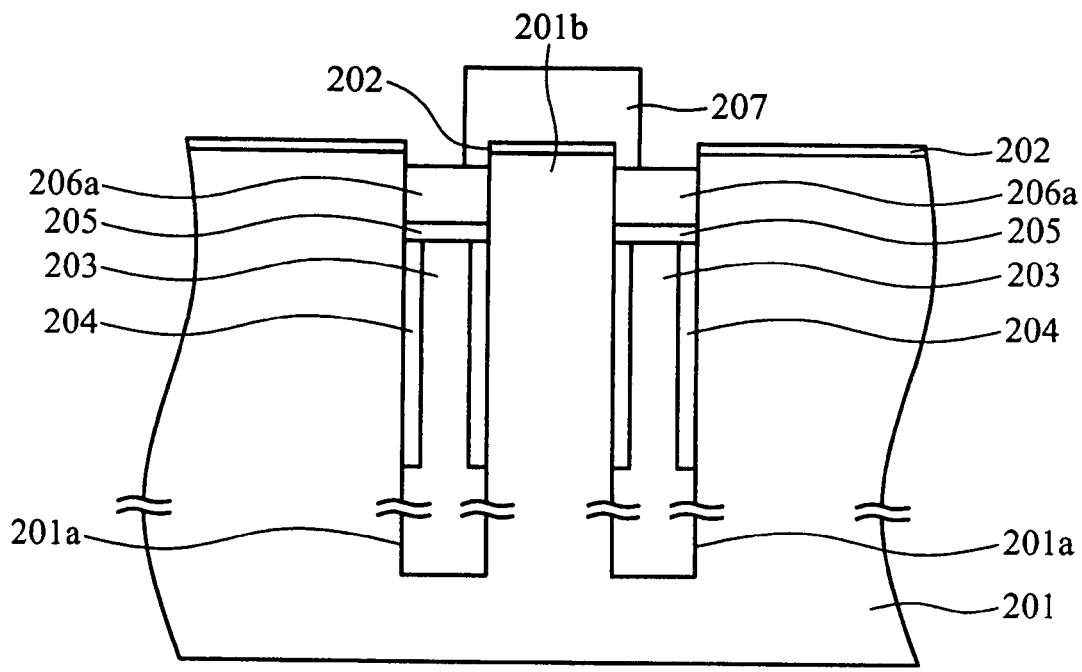
Figure 2F:
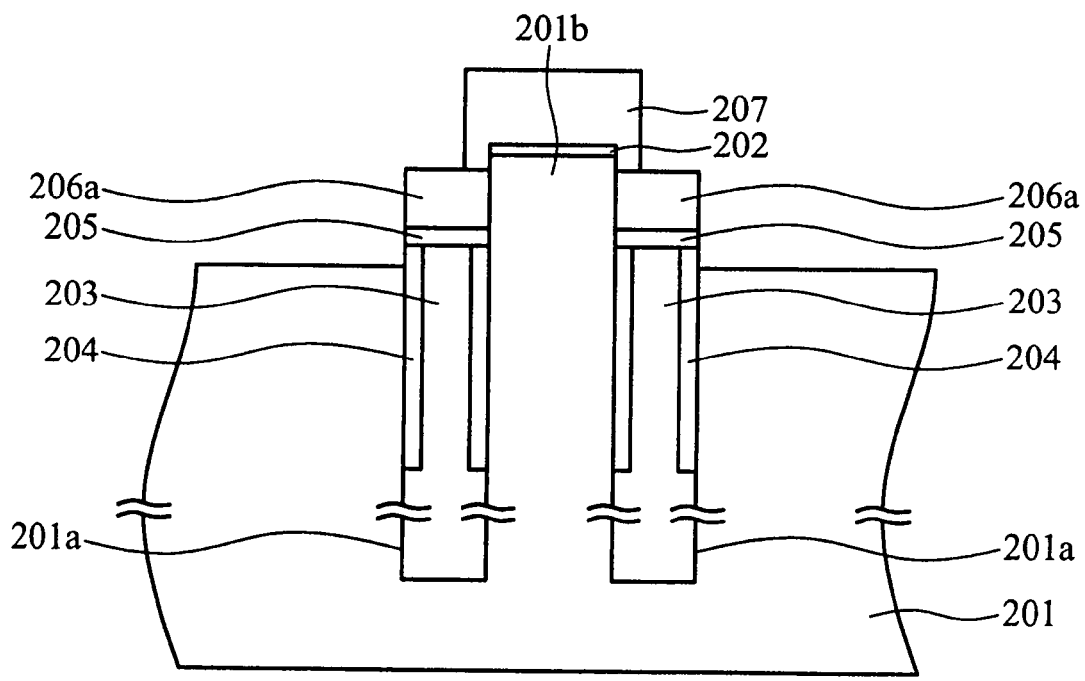
Figure 2G:
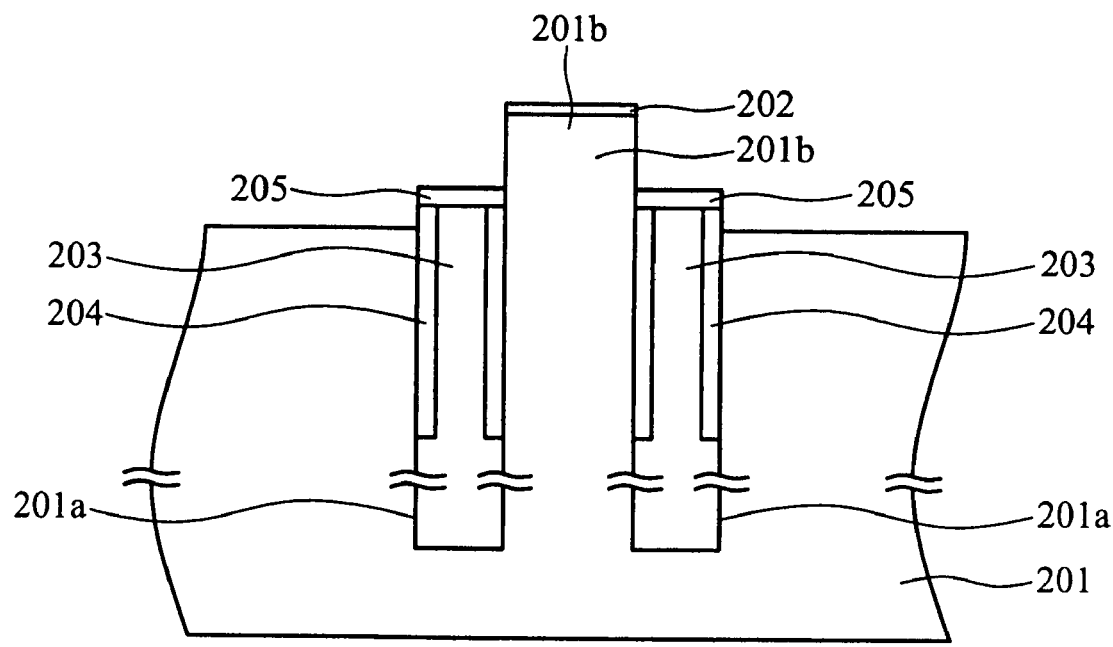
Figure 2H:
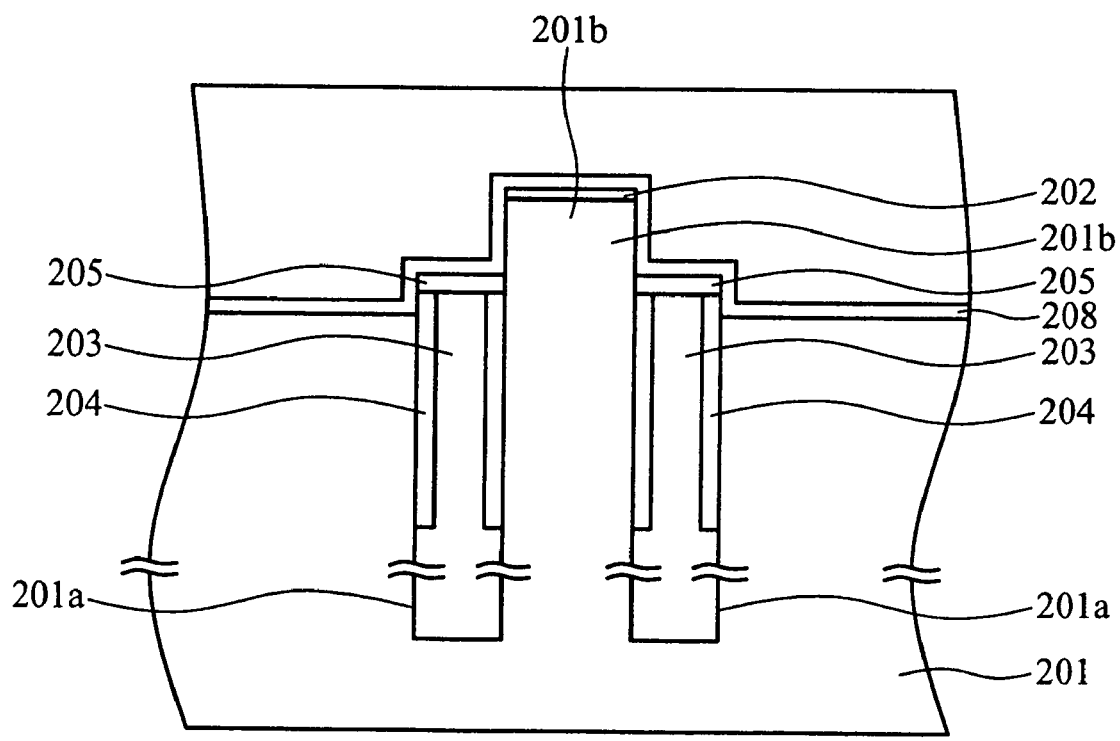
Figure 2I:
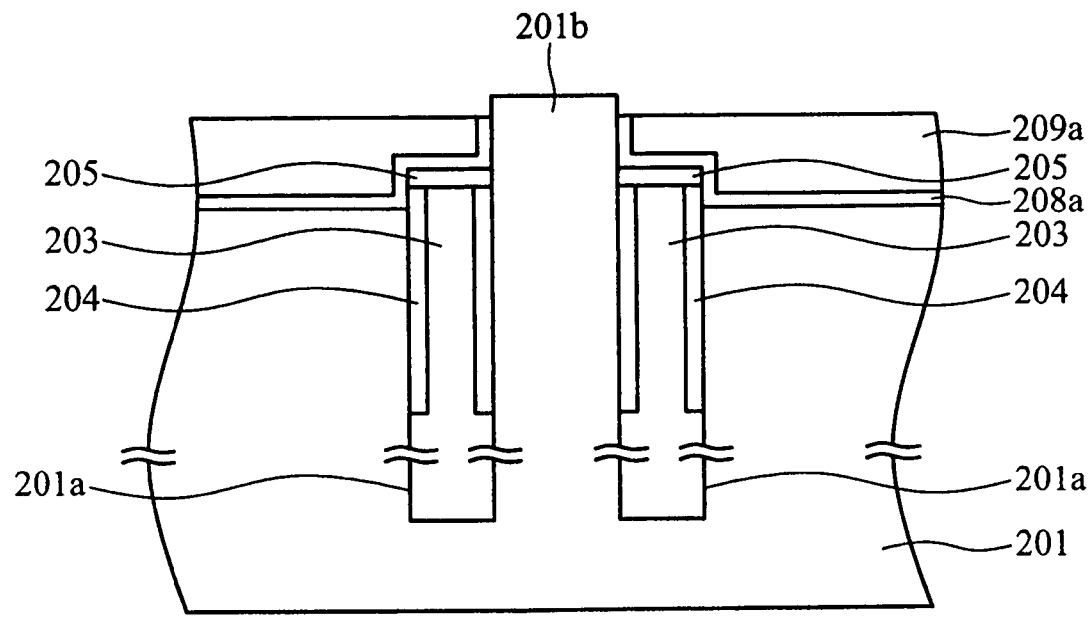
Figure 2J:
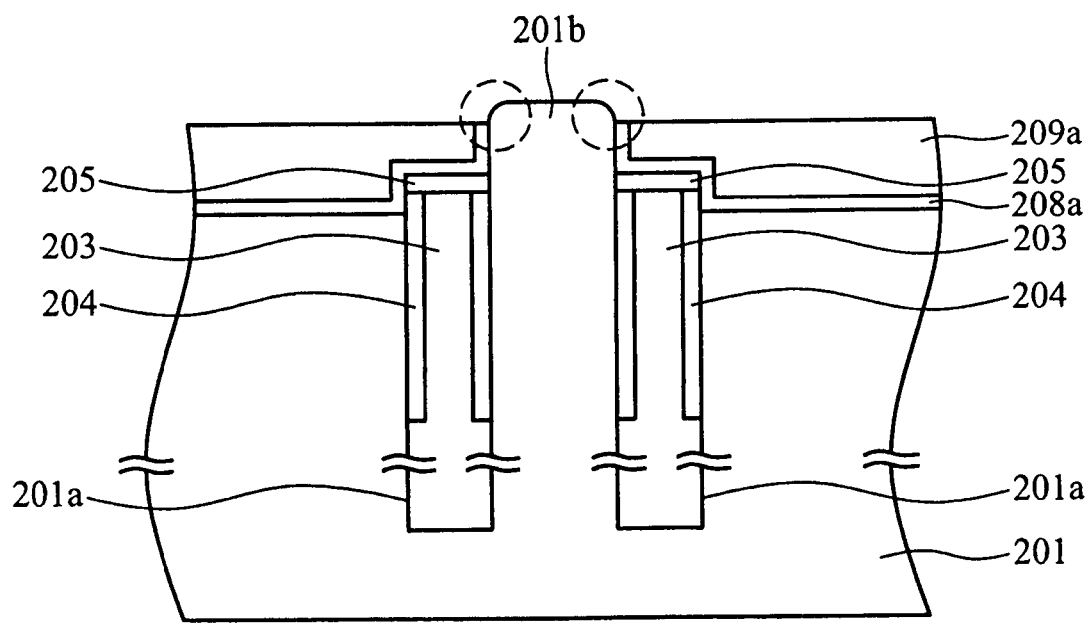
Figure 2K:
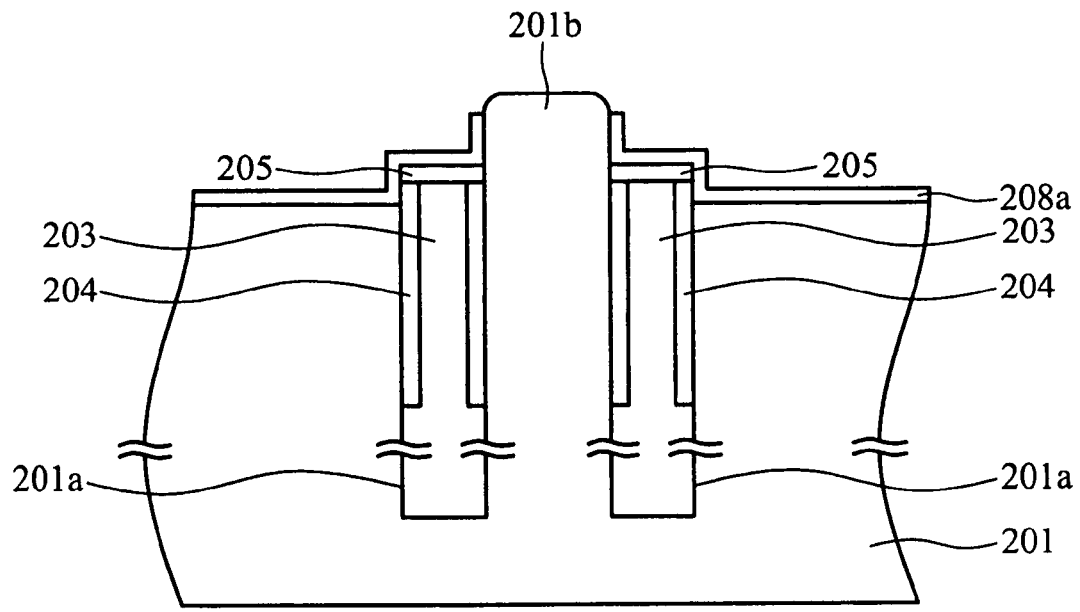
Figure 2L:
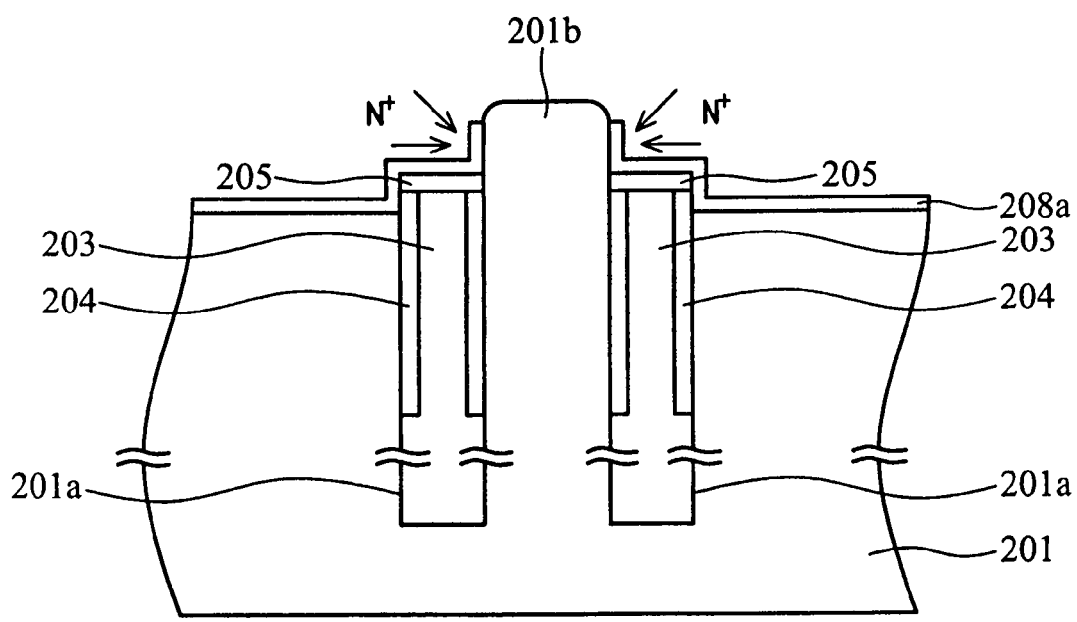
Figure 2M:
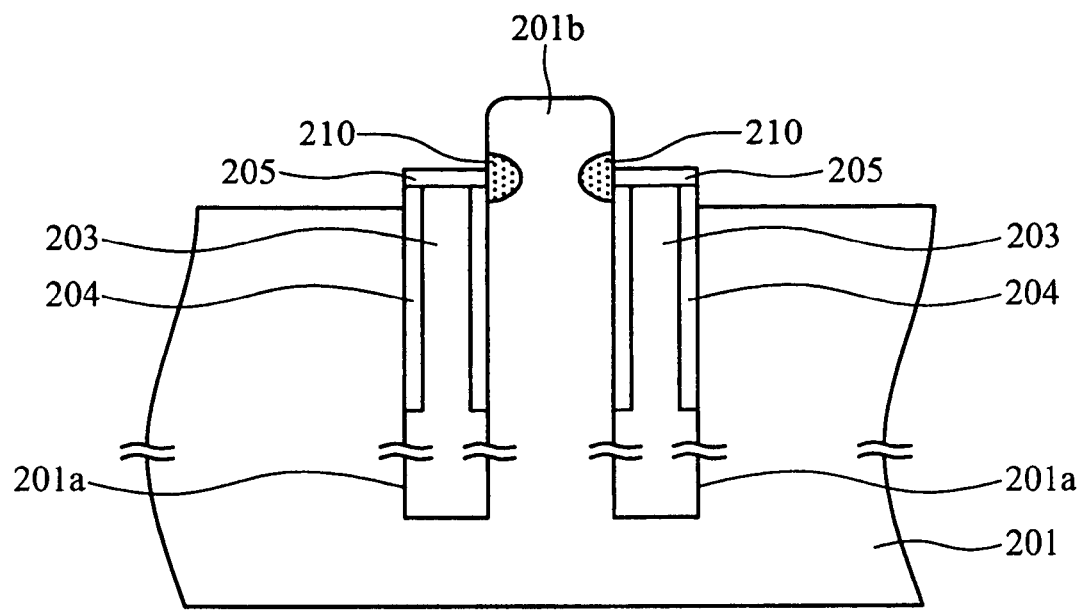
Figure 2N:
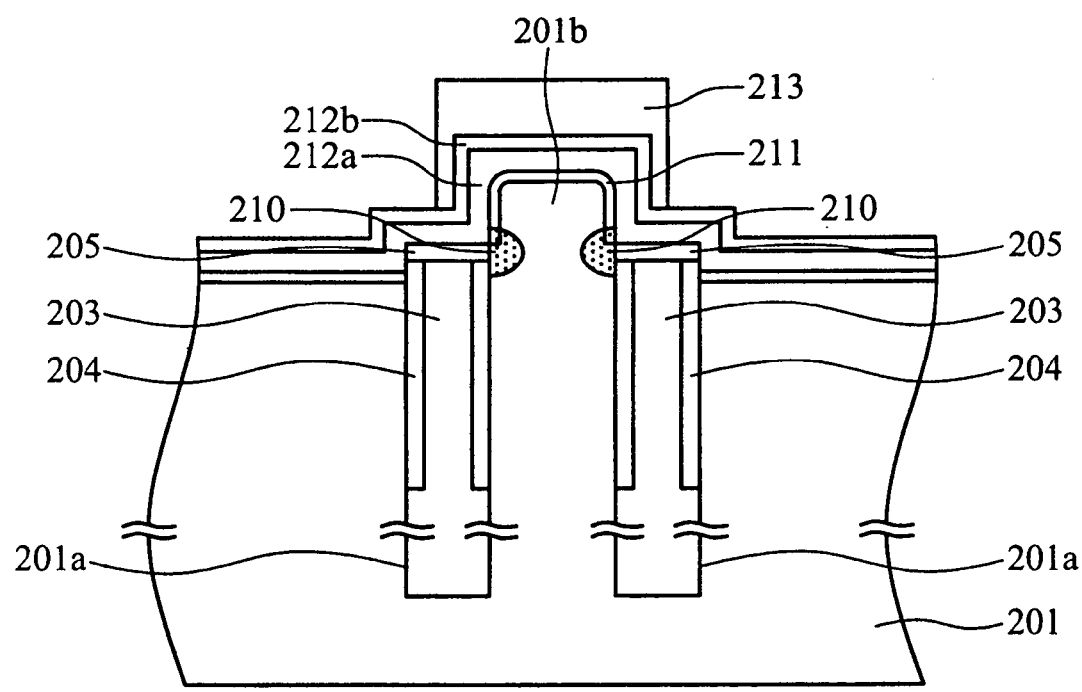
Figure 2O:
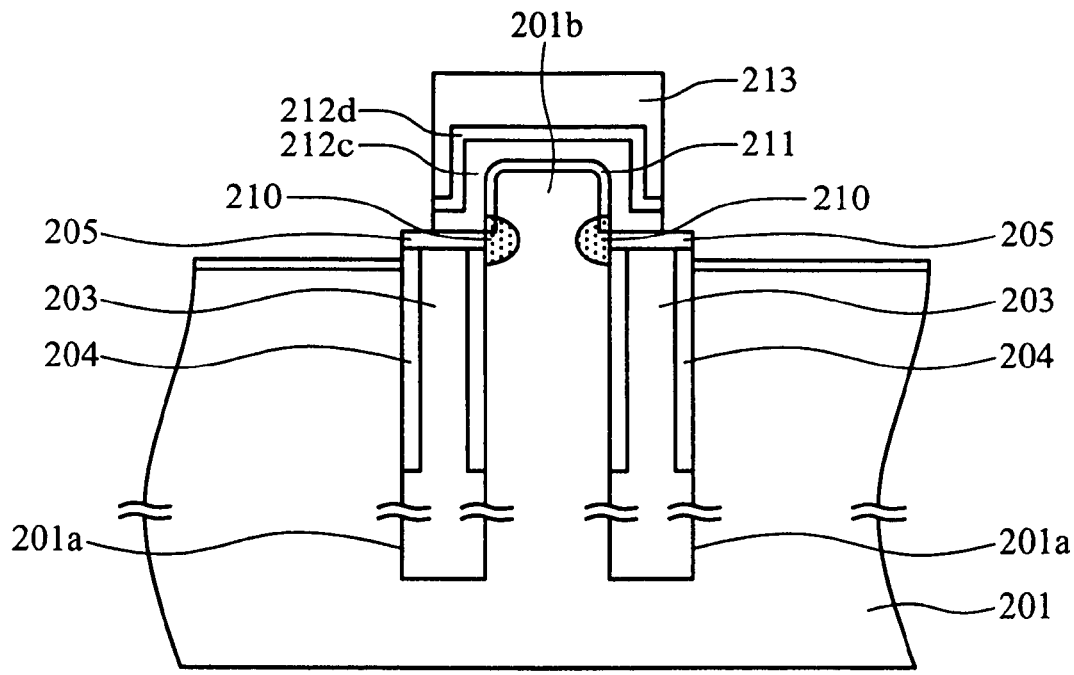
Figure 2P:
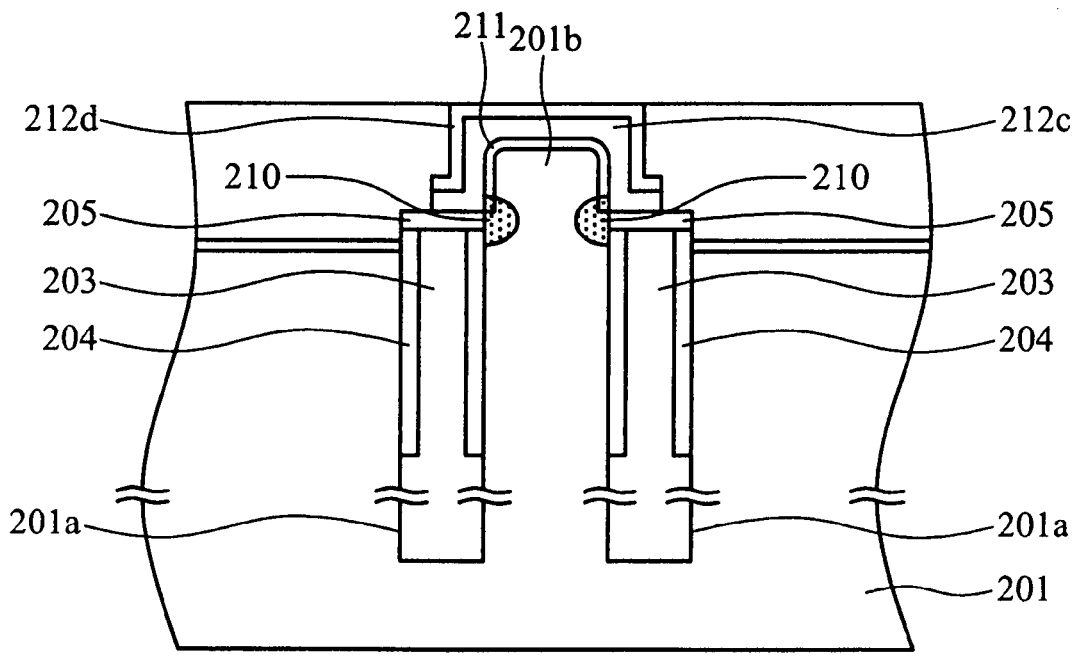
Figure 2Q:
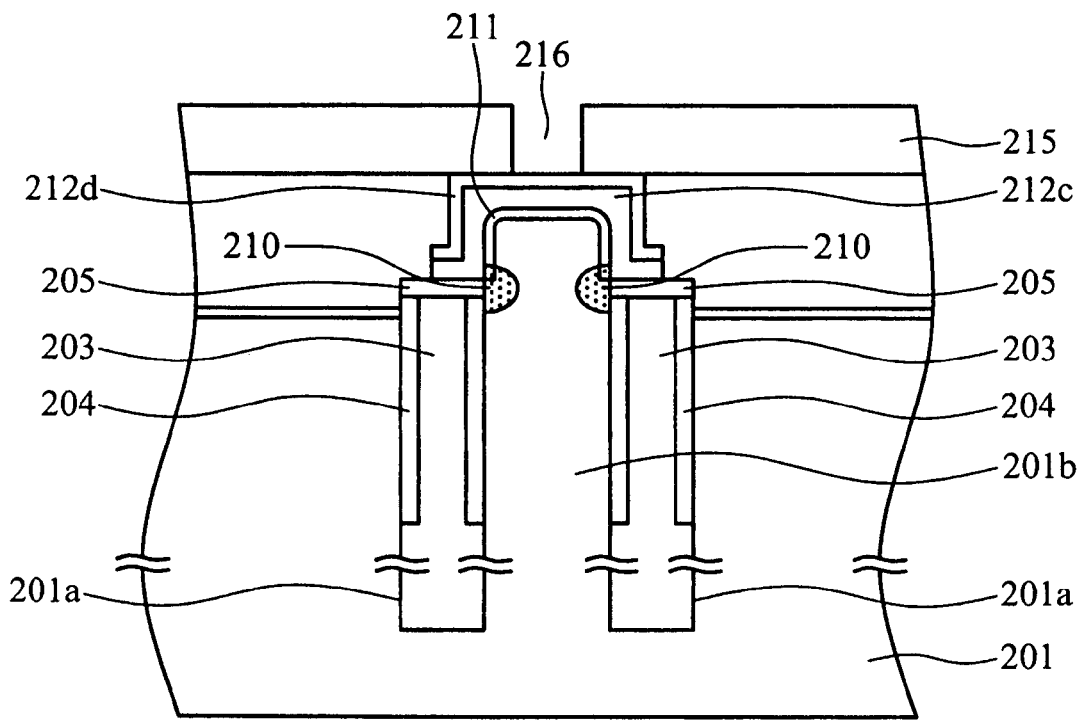
Figure 2R:
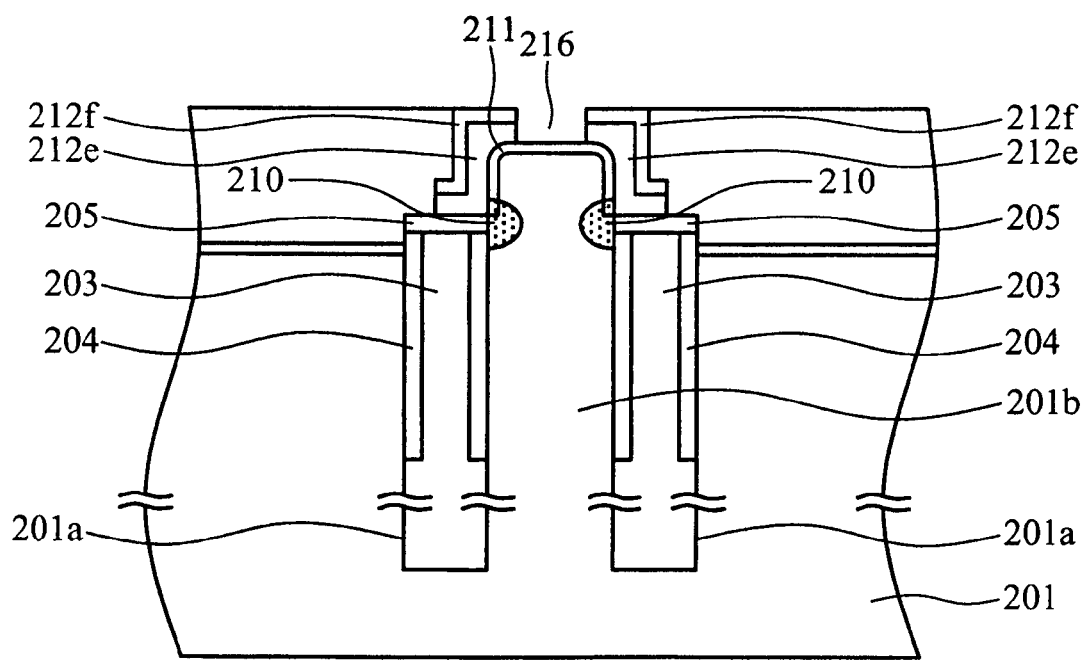
Figure 2S:
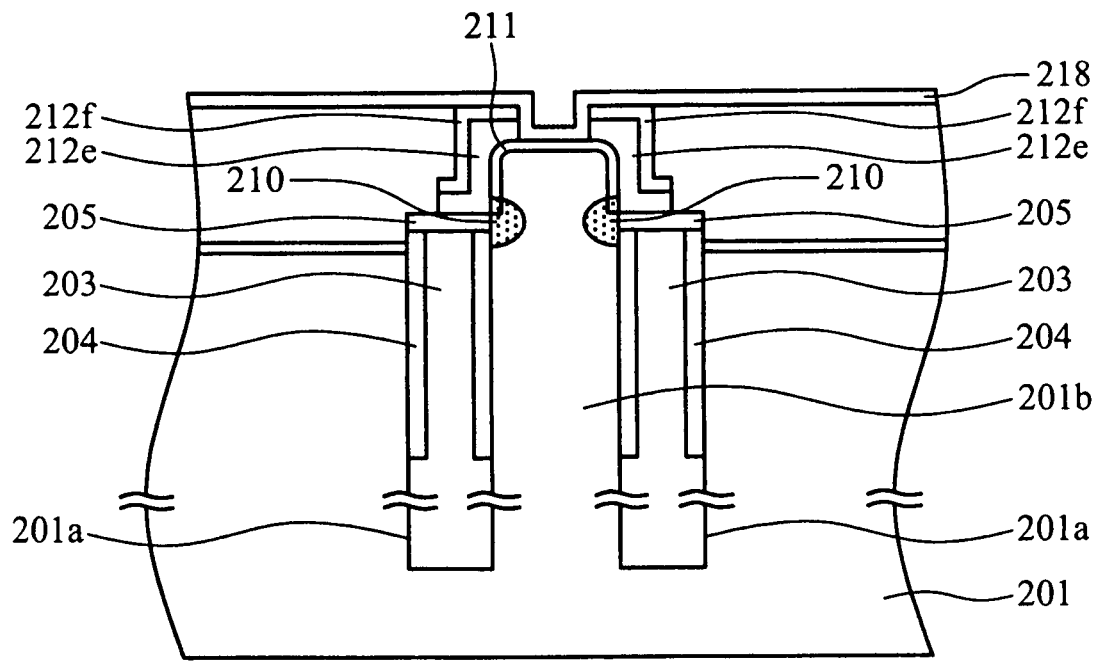
Figure 2T:
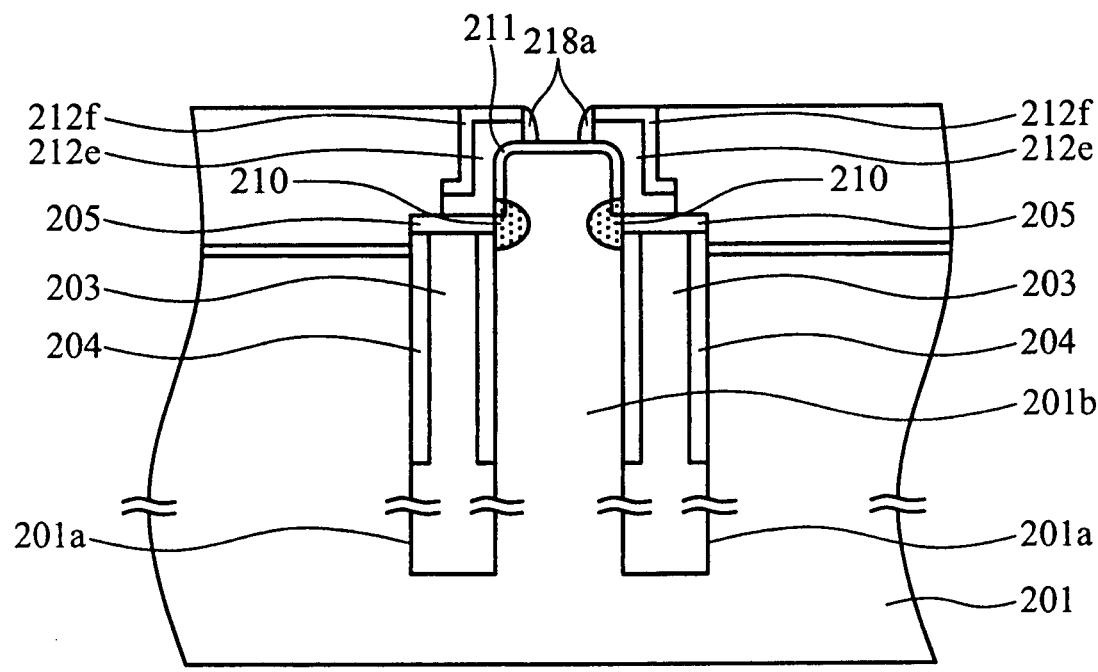

FIGS. 2a to 2t are cross-sections of the method for forming a partial vertical memory cell of the present invention.

In FIG. 2a, a semiconductor substrate 201 is provided, n which a pad layer 202, such as pad oxide layer or pad nitride layer, is formed. Two deep trenches 201a with capacitors are formed in the semiconductor substrate 201 separately by a predetermined distance of about 1200 to 1400 Å from each other. The semiconductor substrate 201 between the deep trenches 201a is an active area as follows. A conducting layer, such as poly layer, is formed on each capacitor acting as a capacitor conducting wire 203 below the semiconductor substrate 201. A length between the semiconductor substrate 201 and the capacitor conducting wire 203 is equal to a channel length of a gate as follows. A collar insulating layer 204, such as a collar oxide layer, is formed in a top sidewall of each deep trench 201a to isolate the gate.

In FIG. 2b, an isolating layer is conformally formed on the semiconductor substrate 201, the deep trenches 201a, and the capacitor conducting wires 203. The isolating layer on the sidewall of the deep trenches 201a is etched to leave the isolating layer 205, such as top trench oxide (TTO) layer, on each capacitor conducting wire 203. The ratio of the isolating layer on the deep trench 201a sidewall to the isolating layer on the capacitor conducting wire 203 surface is less than 1:8. The thickness of the isolating layer on the capacitor conducting wire 203 surface is not much affected when the isolating layer on the deep trench sidewall is etched away.

In FIG. 2c, a mask layer 206, such as organic anti-reflection coating layer, is formed on the pad layer 202, and the deep trenches 201a are filled with the mask layer 206. The organic anti-reflection coating layer is a SiON layer.

In FIG. 2d, the mask layer 206 is planarized by CMP or etching to expose the pad layer 202 and leave the mask layer 206a in each deep trench 201a.

In FIG. 2e, a photoresist layer 207 is formed on the semiconductor substrate 201 between the deep trenches 201a, such that the mask layer 206a is partially covered.

In FIG. 2f, the semiconductor substrate 201 is anisotropically etched by plasma etching or reactive ion etching using the photoresist layer 207 and the mask layer 206a as etching masks until the exposed semiconductor substrate 201 is lower than the isolating layer 205 by a predetermined depth of about 2600 to 3300 Å. Plasma or reactive ion etching is carried out using a gas mixture containing HBr and oxygen.

In FIG. 2g, the photoresist layer 207 and the mask layer 206a are removed. The semiconductor substrate 201b between the deep trenches 201a is a pillar. The pad layer is removed. The pillared semiconductor substrate 201b between the deep trenches 201a is the active area for forming a MOS.

In FIG. 2h, a sacrificial layer 208 and a dielectric layer 209 are conformally formed on the semiconductor substrate 201. The thickness of the sacrificial layer 208, such as nitride layer, is about 120 to 200 Å. The dielectric layer 209, such as HDP oxide layer, covers the semiconductor substrate 201 and the whole active area 201b.

In FIG. 2i, the dielectric layer 209 is planarized to expose the active area 201b by CMP or etching, the dielectric layer 209a approximately level with the active area 201b. The sacrificial layer 208 is lower than the dielectric layer 209a, and top corners of the active area 201b are exposed. The dielectric layer 209 is etched back using the active area 201b and the sacrificial layer 208a as etching masks to level with the sacrificial layer 208a.

In FIG. 2j, the active area 201b is etched using the dielectric layer 209a and sacrificial layer 208a as etching masks to round the top corners to avoid leakage.

In FIG. 2k, the dielectric layer 209a is removed.

In FIG. 2l, bottom corners of the active area 201b are ion implanted by n+ type ions, and the sacrificial layer 208a prevents the ions from damaging the surface of the active area 201b.

In FIG. 2m, after ion implantation, ion-doped areas 210 acting as S/D regions are formed in the active area 201b beside the isolating layer 205. The sacrificial layer 208a is removed.

In FIG. 2n, the semiconductor substrate 201 is thermally oxidized to form an oxide layer acting as a gate dielectric layer 211 on the exposed semiconductor substrate 201a and 201b.

A conducting layer 212a and a hard mask layer 212b, such as a nitride layer, are conformally formed on the semiconductor substrate 201. In this case, the conducting layer 212a comprises a poly layer and a silicide layer.

A patterned mask layer 213, such as photoresist layer, is formed corresponding to the active area 212b and a portion of the isolating layer 205 to cover the conducting layer 212a and the hard mask layer 212b.

In FIG. 2o, the conducting layer 212a and the hard mask layer 212b are sequentially etched using the patterned mask layer 203 as an etching mask to expose the gate dielectric layer 211 and the isolating layer 205, such that a conducting layer 212c and a hard mask layer 212d surrounding the active area 201b are formed.

In FIG. 2p, the patterned mask layer 203 is removed. A dielectric layer 214 is formed on the semiconductor substrate 201, and planarized to level with to the dielectric layer 210, the conducting layer 212c, and the hard mask layer 212d. The dielectric layer 214, such as HDP oxide layer, is formed to isolate the active area 201b.

In FIG. 2q, a patterned mask layer 215, such as photoresist layer, is formed on the dielectric layer 214, the conducting layer 212c, and the hard mask layer 212d. The patterned mask layer 215 has an opening 216, and the conducting layer 212c and hard mask layer 212d are exposed by the opening 216.

In FIG. 2r, the conducting layer 212c and the hard mask layer 212d are etched using the patterned mask layer 215 as an etching mask to expose the gate dielectric layer 211, thereby forming a trench 217. The conducting layer 212c and the hard mask layer 212d are equally distributed to two partial vertical gates 212e and hard masks 212f. The patterned mask layer 215 is removed.

In FIG. 2s, an insulating layer 218, such as nitride layer, is conformally formed on the dielectric layer 214, the conducting layer 212e, the hard mask layer 212f, and the trench 217.

In FIG. 2t, the insulating layer 218 is anisotropically etched by plasma etching or reactive ion etching to expose the gate dielectric layer 211 in the trench, thereby forming a spacer 218a. The spacer 218a is formed to avoid electrical connection of the partial vertical gates 212e.

The partial vertical memory of the present invention comprises the semiconductor substrate 201, the pillared active area 201b, the deep trench capacitors 204, the ion-doped areas 210 acting as S/D, the gate dielectric layer 214, the partial vertical gates 212e conformally formed on the gate dielectric layer around two top corners of the active area, and the hard mask layer 212f.

A channel of each partial vertical gate 212e is combined with a horizontal channel on the top and a vertical channel on the sidewall, a superficial area of the horizontal surface is reduced to ½ time, and a congregation of the memory cell is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a partial vertical memory cell, comprising:
   providing a semiconductor substrate having two deep trenches with capacitors formed therein, the capacitors lower than a top surface of the semiconductor substrate;
   removing a part of the semiconductor substrate outside the deep trenches to form a pillared active area between the deep trenches;
   ion implanting the active area to form an ion-doped area in a corner of the active area acting as a S/D region;
   conformally forming a gate dielectric layer and a conducting layer sequentially to cover the active area;
   forming an isolation beside the conducting layer; and defining the conducting layer to form a first gate and a second gate.

2. The method for forming a partial vertical memory cell of claim 1, wherein the gate dielectric layer is a gate oxide layer.

3. The method for forming a partial vertical memory cell of claim 2, wherein a method for forming the gate oxide layer is a thermal oxidation process.

4. The method for forming a partial vertical memory cell of claim 1, wherein the conducting layer is a poly layer.

5. The method for forming a partial vertical memory cell of claim 1, wherein the isolation is a oxide layer.

6. A method for forming a partial vertical memory cell, comprising:
   providing a semiconductor substrate having two deep trenches with capacitors formed therein, the capacitors lower than a top surface of the semiconductor substrate;
   forming an isolating layer to cover each capacitor;
   filling a mask layer in each deep trench;
   forming a first patterned mask layer to cover the semiconductor substrate between the deep trenches, wherein the first patterned mask layer partially covers the mask layer;
   etching the semiconductor substrate using the first patterned mask layer and the mask layers as etching masks to further below its surface than the isolating layer, thereby forming a pillared active area between the deep trenches;
   removing the first patterned mask layer and the mask layers;
   ion implanting the active area beside the insulating layer to form an ion-doped area acting as a S/D region;
   conformally forming a gate dielectric layer and a conducting layer to cover the semiconductor substrate;
   forming a second patterned mask layer corresponding to the active area and the portion of the mask layers covering the conducting layer;
   etching the conducting layer using the second patterned mask layer as an etching mask so that the conducting layer to cover the active area remains;
   removing the second patterned mask layer;
   forming a dielectric layer to cover the semiconductor substrate to isolate the active area,
   wherein a height of the dielectric layer is equal to the conducting layer;
   forming a third patterned mask layer, having an opening to expose a part of the conducting layer, on the conducting layer and the dielectric; and
   etching the conducting layer using the third patterned mask layer as an etching mask until the gate dielectric layer is exposed to form a trench, and the conducting layer is insulated by the trench to form a first gate and a second gate.

7. The method for forming a partial vertical memory cell of claim 6, wherein the isolating layer is an oxide layer.

8. The method for forming a partial vertical memory cell of claim 6, wherein the mask layer is an ARC layer.

9. The method for forming a partial vertical memory cell of claim 6, wherein the method for etching the semiconductor substrate is anisotropic etching.

10. The method for forming a partial vertical memory cell of claim 6, wherein the gate dielectric layer is a gate oxide layer.

11. The method for forming a partial vertical memory cell of claim 10, wherein the gate oxide layer is formed by thermal oxidation.

12. The method for forming a partial vertical memory cell of claim 6, wherein the conducting layer is a poly layer.

13. The method for forming a partial vertical memory cell of claim 6, wherein the dielectric layer is an oxide layer.

14. A method for forming a partial vertical memory cell, comprising:

providing a semiconductor substrate, with two deep trenches having capacitors formed therein, wherein the capacitors are lower than a top surface of the semiconductor substrate, and a collar insulating layer is formed on a top sidewall of each deep trench;

forming an isolating layer to cover each deep trench capacitor;

filling a mask layer in each deep trench;

forming a first patterned mask layer to cover the semiconductor substrate between the deep trenches, wherein the first patterned mask layer partially covers the mask layer;

etching the semiconductor substrate using the first patterned mask layer and the mask layers as etching masks to further below its surface than the isolating layer, thereby forming a pillared active area between the deep trenches;

removing the first patterned mask layer and the mask layers;

conformally forming a sacrificial layer on the semiconductor substrate outside the active area;

forming a first dielectric layer to cover the sacrificial layer;

planarizing the first dielectric layer and the sacrificial layer until the active area is exposed to further below their surfaces than the active area by a predetermined depth;

etching the active area using the first dielectric layer and the sacrificial layer as etching masks to round corners of the active area;

removing the first dielectric layer;

ion implanting the active area beside the insulating layer to form an ion-doped area acting as a S/D region;

removing the sacrificial layer;

oxidizing the semiconductor substrate to form a gate dielectric layer;

conformally forming a conducting layer on the gate dielectric layer;

forming a second patterned mask layer corresponding to the active area and portions of the mask layers to cover the conducting layer;

etching the conducting layer using the second patterned mask layer as an etching mask to form a gate;

removing the second patterned mask layer;

forming a second dielectric layer;

planarizing the second dielectric layer until the gate is exposed to form an isolation for isolating the active area;

forming a third patterned mask layer, having an opening to expose a part of the conducting layer, on the conducting layer and the dielectric;

etching the conducting layer using the third patterned mask layer as an etching mask until the gate dielectric layer is exposed to form a trench, and the gate is insulated by the trench to form a first gate and a second gate;

removing the third patterned mask layer; and forming a spacer on a sidewall of the trench to avoid electrical connection of the first gate and the second gate.

15. The method for forming a partial vertical memory cell of claim 14, wherein the collar insulating layer is an collar oxide layer.

16. The method for forming a partial vertical memory cell of claim 14, wherein the isolating layer is an oxide layer.

17. The method for forming a partial vertical memory cell of claim 14, wherein the mask layer is an ARC layer.

18. The method for forming a partial vertical memory cell of claim 14, wherein the method for etching the semiconductor substrate is anisotropic etching.

19. The method for forming a partial vertical memory cell of claim 14, wherein the sacrificial layer is a nitride layer.

20. The method for forming a partial vertical memory cell of claim 14, wherein the first dielectric layer is an oxide layer.

21. The method for forming a partial vertical memory cell of claim 14, wherein the gate dielectric layer is a gate oxide layer.

22. The method for forming a partial vertical memory cell of claim 14, wherein the conducting layer is a poly layer.

23. The method for forming a partial vertical memory cell of claim 14, wherein the second dielectric layer is an oxide layer.

24. The method for forming a partial vertical memory cell of claim 14, wherein a method for etching the conducting layer is anisotropic etching.

25. The method for forming a partial vertical memory cell of claim 14, wherein the spacer is a nitride layer.

* * * * *